(12) United States Patent
Huang

(10) Patent No.: US 12,536,644 B2
(45) Date of Patent: Jan. 27, 2026

(54) DETECTION PATTERN UNIT FOR DETECTING PATTERN ON SEMICONDUCTOR DEVICE, AND METHOD AND SYSTEM FOR IMPLEMENTING THE SAME

(71) Applicant: Prosemi Co., Ltd., Tainan (TW)

(72) Inventor: Tian-Xing Huang, Tainan (TW)

(73) Assignee: Prosemi Co., Ltd., Tainan (TW)

( * ) Notice: Subject to any disclaimer, the term of this patent is extended or adjusted under 35 U.S.C. 154(b) by 553 days.

(21) Appl. No.: 17/729,990

(22) Filed: Apr. 26, 2022

(65) Prior Publication Data

US 2022/0343492 A1  Oct. 27, 2022

(30) Foreign Application Priority Data

Apr. 27, 2021 (TW) ................................. 110115195
Oct. 22, 2021 (TW) ................................. 110139303

(51) Int. Cl.
*G06T 7/00* (2017.01)
(52) U.S. Cl.
CPC ............ *G06T 7/0006* (2013.01); *G06T 7/001* (2013.01); *G06T 2207/30148* (2013.01)
(58) Field of Classification Search
CPC .................. G06T 7/0006; G06T 7/001; G06T 2207/30148; G06T 7/73; G06T 7/0004; G03F 1/72; G03F 1/70; G03F 7/70633; G03F 7/70691
USPC ....................................................... 382/151
See application file for complete search history.

(56) References Cited

U.S. PATENT DOCUMENTS

| | | | |
|---|---|---|---|
| 2003/0021466 A1* | 1/2003 | Adel | G06T 7/33 |
| | | | 382/145 |
| 2007/0288219 A1* | 12/2007 | Zafar | G06T 7/0008 |
| | | | 703/14 |
| 2019/0155174 A1* | 5/2019 | Kim | G06T 7/001 |
| 2020/0201193 A1* | 6/2020 | Leshinsky-Altshuller | |
| | | | G03F 7/70683 |
| 2021/0240089 A1* | 8/2021 | Golotsvan | G01N 21/47 |

(Continued)

FOREIGN PATENT DOCUMENTS

EP  3451060 A1 *  3/2019 ........... G01B 11/272

OTHER PUBLICATIONS

Moire-Based Alignment Using Centrosymmetric Grating Marks for High-Precision Wafer Bonding, Huang, Boyan, Wang, Chenxi, Fang, Hui, Zhou, Shicheng, Suga, Tadatomo, Micromachines, 10(5), 339, Digital Object Identifier: 10.3390/mi10050339 , May 22, 2019 (Year: 2019).*

*Primary Examiner* — Jennifer Mehmood
*Assistant Examiner* — Heath E. Wells
(74) *Attorney, Agent, or Firm* — MUNCY, GEISSLER, OLDS & LOWE, P.C.

(57) ABSTRACT

A detection pattern unit includes an inner pattern group, and an outer pattern group that includes two sets of positioning detection patterns, each set including two lines of patterns. For each set, a pitch dimension between adjacent two patterns in one line of the set is the same as a pitch dimension between adjacent two patterns in the other lines of the set. The outer pattern group further includes, for each of two different directions, two connecting lines each extending along the direction and each interconnecting two of the positioning detection patterns respectively from the two lines of a corresponding one of the sets of positioning detection patterns.

16 Claims, 11 Drawing Sheets

(56) References Cited

U.S. PATENT DOCUMENTS

2022/0285284 A1* 9/2022 Mizuta .................. H01L 23/528

* cited by examiner

DETECTION PATTERN UNIT FOR DETECTING PATTERN ON SEMICONDUCTOR DEVICE, AND METHOD AND SYSTEM FOR IMPLEMENTING THE SAME

CROSS-REFERENCE TO RELATED APPLICATION

This application claims priority of Taiwanese Patent Application No. 110115195, filed on Apr. 27, 2021, and Taiwanese Patent Application No. 110139303, filed on Oct. 22, 2021.

FIELD

The disclosure relates to a detection pattern unit, and a method and a system for detecting a pattern on a semiconductor device using the detection pattern unit.

BACKGROUND

As the semiconductor manufacturing industry progresses, the structure of semiconductor devices has become progressively complicated, multi-layered, and dense. In current semiconductor manufacturing processes that involve photolithography, a pre-designed photomask pattern is generated using, for example, a graphic data system (GDS), and is used to manufacture a photomask. Then, light is used to project the pre-designed photomask pattern on the photomask onto a silicon wafer. Afterward, a number of patterning processes such as exposure, development or etching are implemented so as to form the pre-designed photomask pattern on the silicon wafer. It is noted that a number of aspects such as preciseness and accuracy of widths of the wirings of the pre-designed photomask pattern on the silicon wafer are very crucial to the produced semiconductor devices, as electric stability and a degree of down-scaling depend on the preciseness of the pre-designed photomask pattern on the silicon wafer.

During photolithography, a number of conditions such as edge placement error (EPE), light diffraction, optical distortion, etc., may cause the pre-designed photomask pattern on the silicon wafer to differ from the pre-designed photomask pattern originally generated using the GDS. To address this, a number of correction methods such as optical proximity correction (OPC) may be employed. In the OPC, the pre-designed photomask pattern on the silicon wafer and the pre-designed photomask pattern generated using the GDS are compared with each other to calculate a difference between one another, and an adjusted pre-designed photomask pattern is generated using the GDS based on the difference, such that a newly generated photomask based on the adjusted pre-designed photomask pattern to be used for subsequent lithography processes.

It is noted that the OPC is more applicable for one-dimensional patterns, and becomes less accurate for two-dimensional patterns. Additionally, since a number of patterning processes have been implemented, it is impossible to determine which one of the patterning processes caused the difference between the pre-designed photomask pattern on the silicon wafer and the pre-designed photomask pattern generated using the GDS. Therefore, the OPC may be repeated and the photomask pattern may be adjusted many times in order to achieve the desired effect.

SUMMARY

Therefore, one object of the disclosure is to provide a detection pattern unit that is for detecting a to-be-detected pattern unit.

According to one embodiment of the disclosure, the detection pattern unit includes an inner pattern group that includes at least one detecting pattern and an outer pattern group that is located to surround the inner pattern group, and that includes two sets of positioning detection patterns. Each of the two sets of positioning detection patterns includes two lines of the positioning detection patterns that are arranged along a direction.

For each of the two sets of positioning detection patterns, the two lines of the positioning detection patterns in the set include the same number of the positioning detection patterns, and a pitch dimension between adjacent two of the positioning detection patterns in one of the two lines of the set is the same as a pitch dimension between adjacent two of the positioning detection patterns in the other of the two lines of the set.

The pitch dimension between adjacent two of the positioning detection patterns in one of the two lines of one of the sets is the same as or different from the pitch dimension between adjacent two of the positioning detection patterns in one of the two lines of the other one of the sets.

The outer pattern group further includes, for each of two different directions, two connecting lines each extending along the direction and each interconnecting two of the positioning detection patterns respectively from the two lines of patterns of a corresponding one of the sets of positioning detection patterns.

Another effect of the disclosure is to provide a method for detecting a pattern on a semiconductor device using the above-mentioned detection pattern unit.

According to the disclosure, the method is for detecting a pattern on a semiconductor device, is implemented using a computer device and includes:

obtaining the detection pattern unit and a to-be-detected pattern unit that corresponds with the detection pattern unit, the to-be-detected pattern unit including an inner pattern group that includes at least one wiring pattern, and two sets of positioning patterns that respectively correspond with the two sets of positioning detection patterns, each of the two sets of positioning patterns including two lines of the positioning patterns that are arranged along a direction, wherein for each of the two sets of positioning patterns, a pitch dimension between adjacent two of the positioning patterns in one of the two lines of the set is the same as a pitch dimension between adjacent two of the positioning patterns in the other one of the two lines of the set;

with respect to the to-be-detected pattern unit, generating, for each of the two different directions, two connecting lines each extending along the direction and each interconnecting two of the positioning patterns respectively from the two lines of positioning patterns of one of the sets of positioning patterns, and four intersections defined by the connecting lines;

superimposing a first image on a second image, where the first image has the to-be-detected pattern unit and the connecting lines generated with respect to the to-be-detected pattern unit, and the second image has the detection pattern unit and the connecting lines included by the outer pattern group;

adjusting a relative position between the first image and the second image such that the connecting lines of the first image coincide respectively with the connecting lines of the second image or such that the intersections of the first image coincide respectively with the intersections of the second image, so as to obtain a superimposed image unit that includes a number of superimposed patterns, each of the superimposed patterns including one of the at least one wiring pattern from the first image and one of the at least one detecting pattern from the second image that corresponds to said one of the at least one wiring pattern; and for each of the superimposed patterns, calculating a difference between said one of the at least one wiring pattern from the first image and said one of the at least one detecting pattern from the second image.

Another effect of the disclosure is to provide a system for detecting a pattern on a semiconductor device using the above-mentioned detection pattern unit.

According to one embodiment of the disclosure, the system includes:

a data obtaining unit configured to obtain the detection pattern unit and a to-be-detected pattern unit that corresponds with the detection pattern unit, the to-be-detected pattern unit including an inner pattern group that includes at least one wiring pattern, and two sets of positioning patterns that respectively correspond with the two sets of positioning detection patterns, each of the two sets of positioning patterns including two lines of the positioning patterns that are arranged along a direction, wherein for each of the two sets of positioning patterns, a pitch dimension between adjacent two of the positioning patterns in one of the two lines of the set is the same as a pitch dimension between adjacent two of the positioning patterns in the other one of the two lines of the set;

a positioning unit that is configured to:
with respect to the to-be-detected pattern unit, generate, for each of the two different directions, two connecting lines each extending along the direction and each interconnecting two of the positioning patterns respectively from the two lines of positioning patterns of one of the sets of positioning patterns, and four intersections defined by the connecting lines;
superimpose a first image on a second image, where the first image has the to-be-detected pattern unit and the connecting lines generated with respect to the to-be-detected pattern unit, and the second image has the detection pattern unit and the connecting lines included by the outer pattern group; and
adjust a relative position between the first image and the second image such that the connecting lines of the first image coincide respectively with the connecting lines of the second image, or such that the intersections of the first image coincide respectively with the intersections of the second image, so as to obtain a superimposed image unit that includes a number of superimposed patterns, each of the superimposed patterns including one of the at least one wiring pattern from the first image and one of the at least one detecting pattern from the second image that corresponds to the one of the at least one wiring pattern; and a computing unit that is configured to, for each of the superimposed patterns, calculate a difference between the one of the at least one wiring pattern from the first image and the one of the at least one detecting pattern from the second image.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
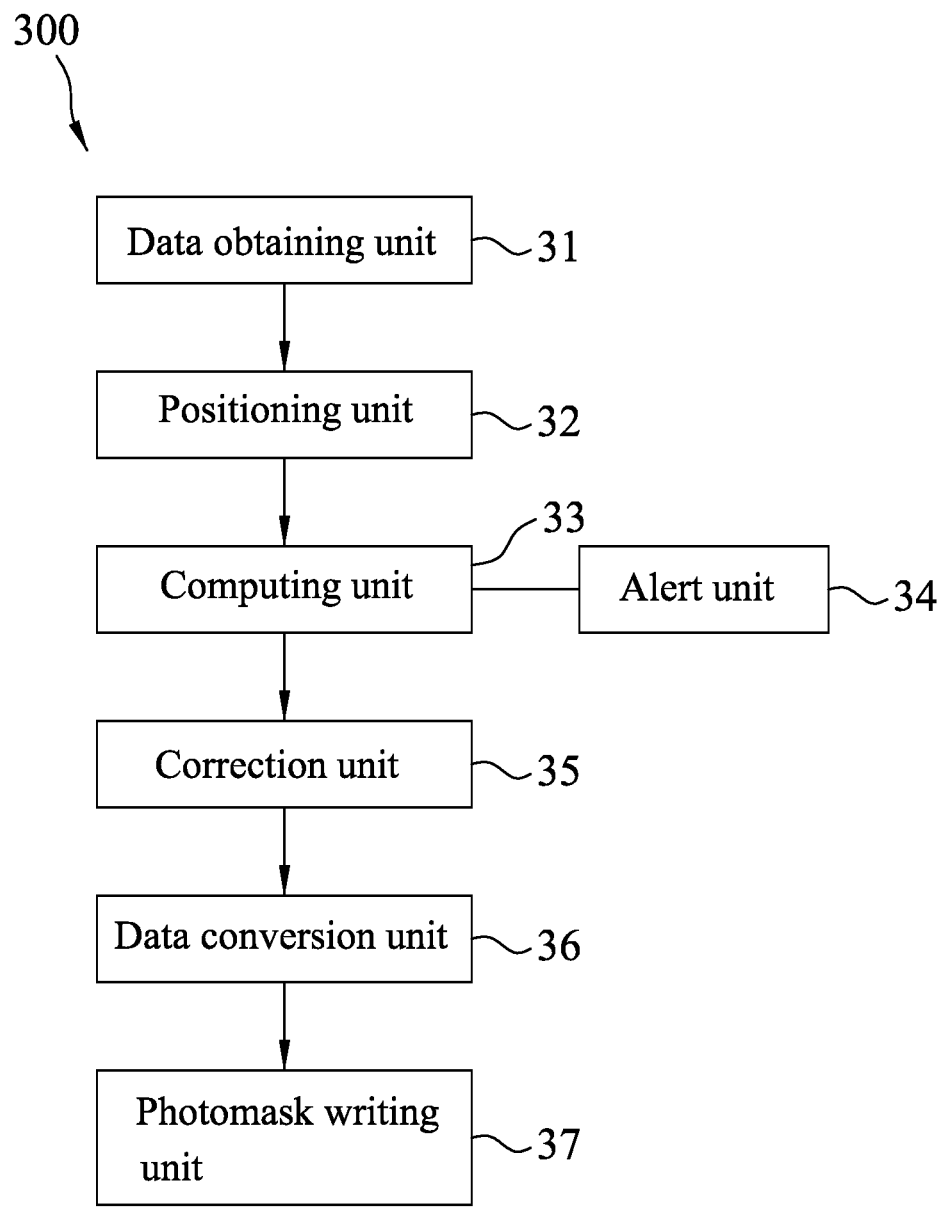
FIG. 1 is a block diagram illustrating a pattern detecting system according to one embodiment of the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Throughout the disclosure, the term "coupled to" or "connected to" may refer to a direct connection among a plurality of electrical apparatus/devices/equipment via an electrically conductive material (e.g., an electrical wire), or an indirect connection between two electrical apparatus/devices/equipment via another one or more apparatus/devices/equipment, or wireless communication.

In one embodiment, the pattern detecting method may be implemented using a computer device that includes a processor, a storage medium and a pattern detecting system. The computer device may be embodied using a personal computer, a server device, etc.

The processor may include, but not limited to, a single core processor, a multi-core processor, a dual-core mobile processor, a microprocessor, a microcontroller, a digital signal processor (DSP), a field-programmable gate array (FPGA), an application specific integrated circuit (ASIC), a radio-frequency integrated circuit (RFIC), etc.

The storage medium may be embodied using, for example, random access memory (RAM), read only memory (ROM), programmable ROM (PROM), firmware, flash memory, etc.

The pattern detecting system may be embodied using a number of components connected to the computer device, and a software application stored in the storage medium. The software application includes instructions that, when executed by the processor, cause the processor to perform operations as described below.

FIG. 1 is a block diagram illustrating a pattern detecting system 300 according to one embodiment of the disclosure. The pattern detecting system 300 is configured to implement the pattern detecting method, and includes a data obtaining unit 31, a positioning unit 32 coupled to the data obtaining unit 31, a computing unit 33 coupled to the positioning unit 32, an alert unit 34 coupled to the computing unit 33, a correction unit 35 coupled to the computing unit 33, a data conversion unit 36 coupled to the correction unit 35, and a photomask writing unit 37 coupled to the data conversion unit 36.

The data obtaining unit 31 may be embodied using a stepper, a scanner, a diffractometer, an electron microscope, an optical microscope or other optical imaging equipment. The data obtaining unit 31 is capable of obtaining a detection pattern unit 2 (see FIG. 2) that may be stored in the storage medium, and data for a to-be-detected pattern unit 4 of a selected area of a semiconductor device pattern (see FIG. 6). The detection pattern unit 2 includes two sets of positioning detection patterns 221A, 221B.

In this embodiment, the to-be-detected pattern unit 4 is an image of a fabricated semiconductor device obtained using a stepper, a scanner, a diffractometer, an electron microscope, an optical microscope or other optical imaging equipment. Specifically, the to-be-detected pattern unit 4 may be an image of a pattern formed by a patterning process on a substrate of the semiconductor device. The patterning process may be one of lithography, dry etching and wet etching. The substrate may be a semiconductor substrate, a dielectric substrate, a metal substrate, or a glass substrate that may be used for forming a photomask pattern.

The to-be-detected pattern unit 4 includes two sets of positioning patterns 421A, 421B that correspond with the sets of positioning detection patterns 221A, 221B, respectively.

With respect to the detection pattern unit 2, the positioning unit 32 is configured to generate, for each of two different directions, two connecting lines each extending along the direction and each interconnecting two of the positioning detection patterns from one of the sets of positioning detection patterns 221A, 221B (four total connecting lines), and four intersections defined by the connecting lines. Similarly, with respect to the to-be-detected pattern unit 4, the positioning unit 32 is configured to generate, for each of two different directions, two connecting lines each interconnecting two positioning patterns from one of the sets of positioning patterns 421A, 421B (four total connecting lines), and therefore four intersections defined by the connecting lines.

Then, the positioning unit 32 is configured to superimpose a first image on a second image, where the first image has the to-be-detected pattern unit 4 with the corresponding connecting lines and the second image has the detection pattern unit 2 with the corresponding connecting lines, and to adjust a relative position between the first image and the second image such that the connecting lines of the first image coincide respectively with the connecting lines of the second image or the intersections of the first image coincide respectively with the intersections of the second image. As such, a number of superimposed patterns may be obtained. Each of the superimposed patterns is composed of one pattern from the first image superimposed on one corresponding pattern from the second image.

The computing unit 33 is configured to, for each of the superimposed patterns, calculate a difference between the pattern from the first image and the corresponding pattern from the second image (e.g., a displacement from the pattern to the corresponding pattern).

In practice, the computing unit 33 may be configured to calculate multiple differences (in different aspects) between the patterns from the first and second images.

The alert unit 34 is configured to, when the difference between the pattern from the first image and the corresponding pattern from the second image calculated by the computing unit 33 is larger than a threshold, generate and output an alert.

The correction unit 35 is configured to, in response to receipt of the calculation from the computing unit 33, operate a graphic data system (GDS), an open artwork system interchange system (OASIS) program, a manufacturing electron beam exposure system (MEBES), a computer aided design (CAD) program or an electronic design automation (EDA) program to perform a correction operation, so as to generate a calibrated image.

The data conversion unit 36 is configured to convert the calibrated image into a data file in a data stream format for data exchange, such as a GDSII file, an OASIS file, an MEBES file, etc.

The photomask writing unit 37 is coupled to the data conversion unit 36, and may be embodied using an e-beam writing system that is configured to receive the data file and to generate a calibrated photomask that corresponds with the calibrated image based on the data file. The calibrated photomask thus generated may then be used for fabrication of new semiconductor devices with the differences compensated for.

Figure 2:
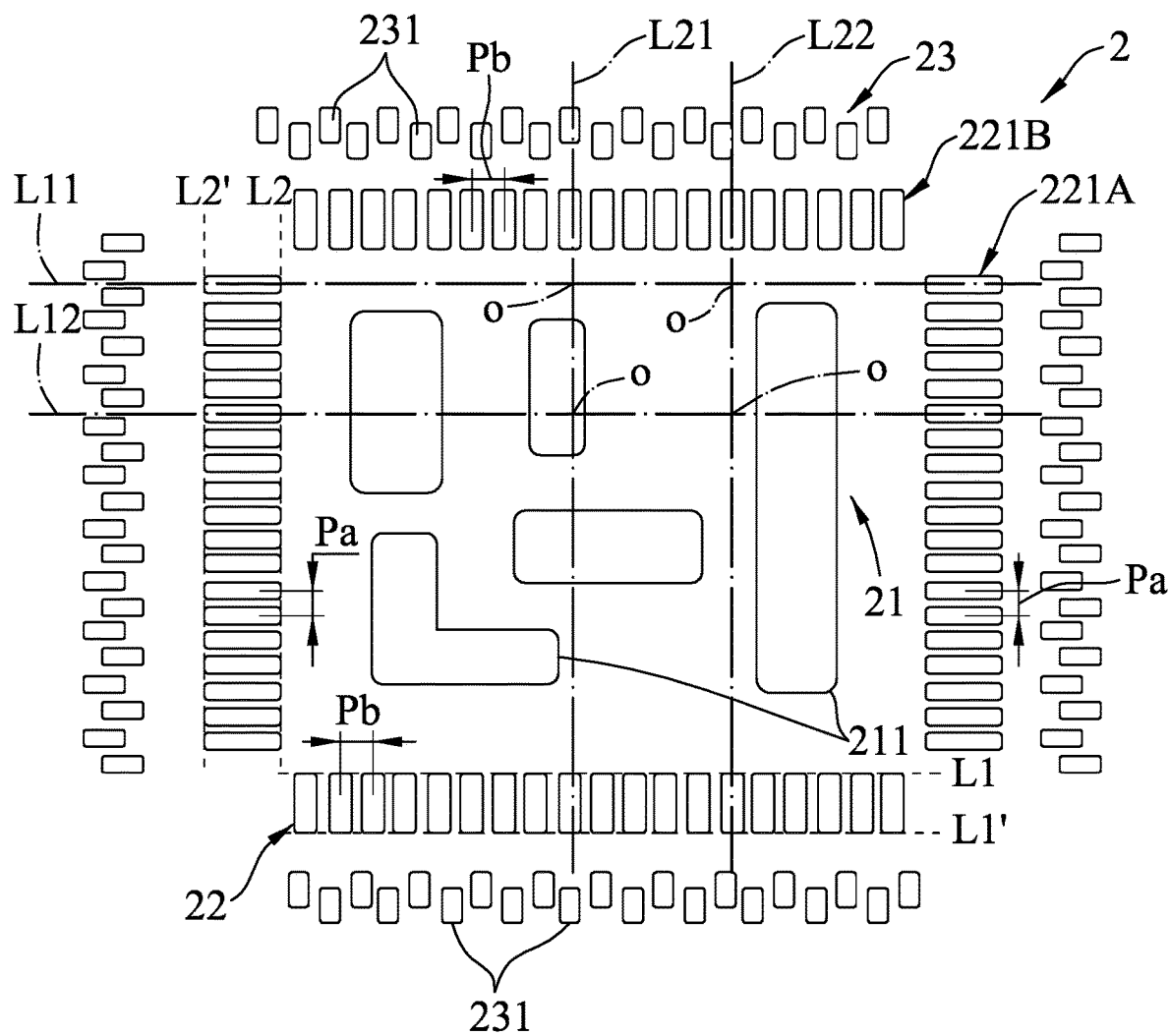
FIG. 2 is a top view of an exemplary detection pattern unit according to one embodiment of the disclosure.

FIG. 2 is a top view of an exemplary detection pattern unit 2 according to one embodiment of the disclosure. In this embodiment, the detection pattern unit 2 includes an inner pattern group 21, an outer pattern group 22 and an auxiliary pattern group 23.

The inner pattern group 21 includes at least one detecting pattern 211. In the example of FIG. 2, the inner pattern group 21 includes a plurality of detecting patterns 211 spaced apart from one another. The detecting patterns 211 may be designed to have shapes and sizes to correspond with specific semiconductor patterns (e.g., isolated patterns, high density patterns, or low density patterns) having the same or different pitch dimensions. It is noted that the term "pitch dimension" used throughout the disclosure refers to a distance between centers of two elements (e.g., two patterns), and may cover the lines and spacing therebetween.

The outer pattern group 22 is located to surround the inner pattern group 21, and includes two sets of positioning detection patterns 221A, 221B. Each of the two sets of positioning detection patterns 221A, 221B includes two lines of the positioning detection patterns (also called "two lines of patterns" for short) that are arranged along a direction. That is to say, the outer pattern group 22 includes four lines of patterns that are arranged around the inner pattern group 21 to form a near-square shape.

In this embodiment, the set of positioning detection patterns 221A includes two lines of the positioning detection patterns (also called "two lines of patterns" for short) that are arranged along and opposite to each other in a direction X, and the set of positioning detection patterns 221B includes two lines of patterns that are arranged along and opposite to each other in a direction Y perpendicular to the direction X. Each of the two sets of positioning detection patterns 221A, 221B may be a high density pattern, a low density pattern, a mirror symmetric pattern, a horizontally symmetric pattern or a vertically symmetric pattern.

In this embodiment, for the set of positioning detection patterns 221A, a pitch dimension (Pa) between two adjacent patterns in one of the lines in the set 221A may be the same as a pitch dimension (Pa) between two adjacent patterns in the other one of the lines in the set 221A, and for the set of positioning detection patterns 221B, a pitch dimension (Pb)

between two adjacent patterns in one of the lines in the set 221B may be the same as a pitch dimension (Pb) between two adjunct patterns in the other one of the lines in the set 221B. The pitch dimensions (Pa) between two adjacent patterns in one of the two lines of patterns of the set of positioning detection patterns 221A may be the same as or different from the pitch dimensions (Pb) between two adjacent patterns in one of the two lines of patterns of the set of positioning detection patterns 221B. Each of the two lines of patterns in the set of positioning detection patterns 221B has a dimension (PXn) along the direction X.

In use, as described above, the positioning unit 32 is configured to generate, for each of two different directions (e.g., the directions X and Y), two connecting lines each extending along the direction and each interconnecting two of the positioning detection patterns respectively from the two lines of patterns in a corresponding one of the sets of positioning detection patterns 221A, 221B (four connecting lines in total), and four intersections defined by the connecting lines. In the example of FIG. 2, four connecting lines (L11, L12 along the direction X, and L21, L22 along the direction Y), and four intersections (o) are generated.

The auxiliary pattern group 23 includes at least one line of auxiliary patterns 231. The line may be disposed at a side of the outer pattern group 22 away from the inner pattern group 21. In the example of FIG. 2, the auxiliary pattern group 23 includes four lines of auxiliary patterns 231 disposed respectively at four sides of the outer pattern group 22.

In the example of FIG. 2, for each of the sets of positioning detection patterns 221A, 221B, the pitch dimensions between any two adjacent patterns in the same line are identical. The set of positioning detection patterns 221A includes two lines, and each line includes a number of patterns. In this embodiment, for each of the sets 221A and 221B, the two lines of the positioning detection patterns of the set 221A or 221B include the same number of patterns. Each of the patterns may have an inner end facing the inner pattern group 21 and an outer end facing away from the inner pattern group 21; in one line of the set of positioning detection patterns 221A, the inner ends respectively of the patterns are aligned along a straight line (L1), and the outer ends respectively of the patterns are aligned along a straight line (L1'). Similarly, the set of positioning detection patterns 221B includes two lines, and each line includes a number of patterns. Each of the patterns may have an inner end and an outer end; in one line of the set of positioning detection patterns 221B, the inner ends respectively of the patterns are aligned along a straight line (L2), and the outer ends respectively of the patterns are aligned along a straight line (L2'). An angle defined by one of the lines L1, L1' and one of the lines L2, L2' is 90 degrees (i.e., a right angle). The patterns included in the set of positioning detection patterns 221A may have a density that is different from that of the patterns included in the set of positioning detection patterns 221B. Alternatively, the patterns included in the set of positioning detection patterns 221A and the patterns included in the set of positioning detection patterns 221B may have the same density.

Figure 11:
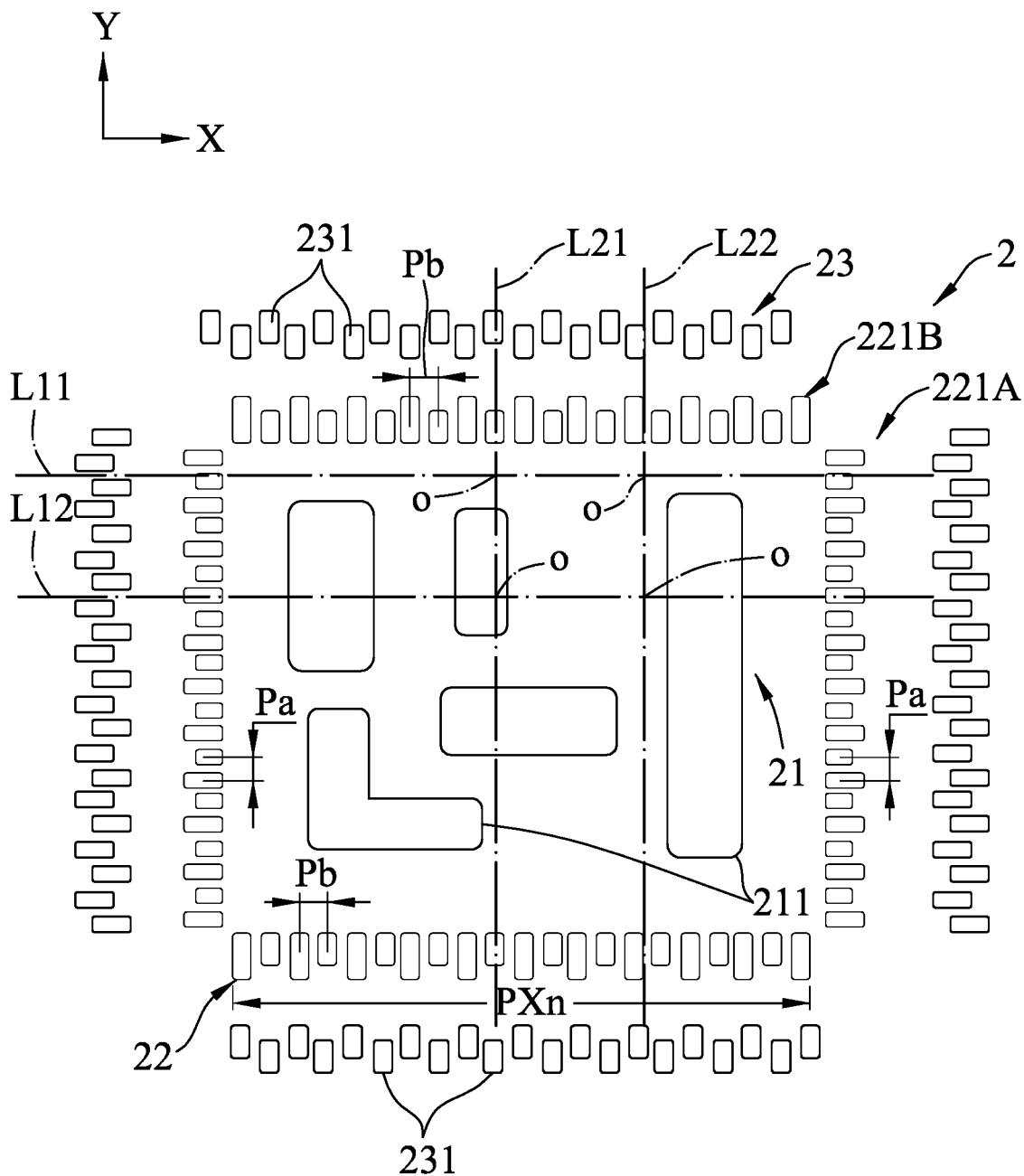
FIG. 11 is a top view of another exemplary detection pattern unit according to one embodiment of the disclosure.

It is noted that in some embodiments (as shown in FIG. 11), for each of the sets of positioning detection patterns 221A, 221B the outer ends respectively of the patterns may be not aligned along a straight line.

Two lines of auxiliary patterns 231 are arranged to extend along the direction X, and each of the auxiliary patterns 231 has an inner end facing the outer pattern group 22 and an outer end facing away from the outer pattern group 22. The inner ends of the auxiliary patterns 231 are not arranged on a straight line, nor are the outer ends of the auxiliary patterns 231, meaning that the auxiliary patterns 231 are not aligned along the direction X.

It is noted that while in the example of FIG. 2, each of the patterns included in the outer pattern group 22 may have the same dimensions, in other embodiments, each of the patterns included in the outer pattern group 22 may have different sizes. That is to say, in some embodiments, for the set of positioning detection patterns 221A, while the inner ends (or the outer ends) of the patterns are aligned along one straight line (L1 or L1'), the outer ends (or the inner ends) of the patterns may not necessarily be aligned along a straight line. Also, for the set of positioning detection patterns 221B, while the inner ends (or the outer ends) of the patterns are aligned along one straight line (L2 or L2'), the outer ends (or the inner ends) of the patterns may not necessarily be aligned along a straight line. Additionally, the patterns included in the set of positioning detection patterns 221A may have a density that is identical to that of the patterns included in the set of positioning detection patterns 221B.

Figure 3:
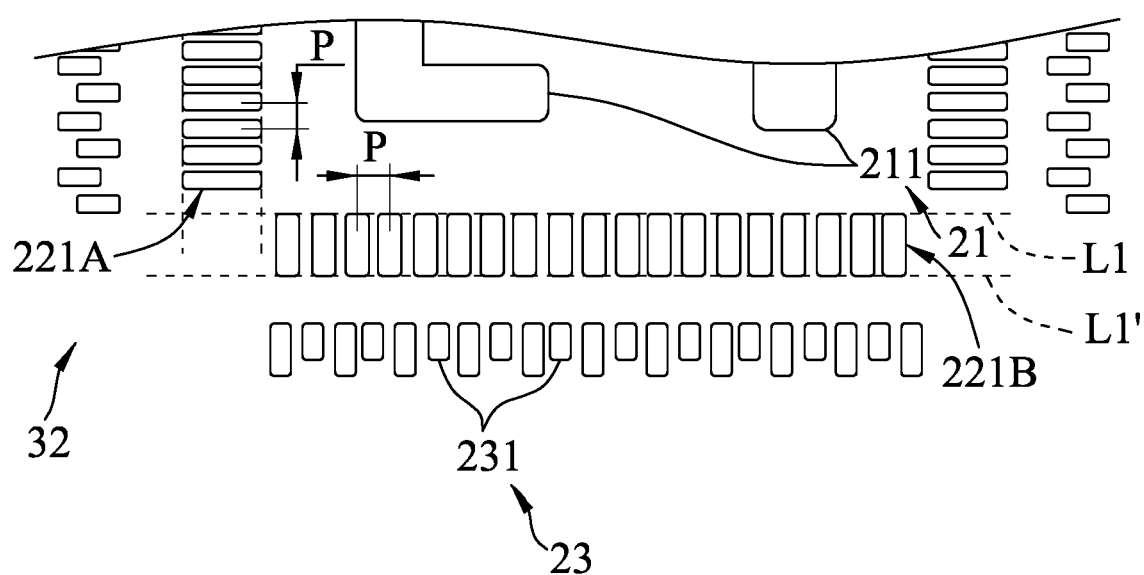
FIG. 3 is a fragmentary top view of another detection pattern unit according to one embodiment of the disclosure.

For one of the lines of auxiliary patterns 231, it may be the case that the inner ends facing the outer pattern group 22 are aligned along a straight line, while the outer ends facing away from the outer pattern group 22 are arranged to not fall on a straight line. FIG. 3 is a fragmentary view of another detection pattern unit according to one embodiment of the disclosure, showing one such arrangement which makes a contour of the detection pattern unit 2 not a straight line, and therefore more recognizable.

In other embodiments, one, two or three lines of auxiliary patterns 231 may be present, and each of the lines may be arranged in a manner that is different from that shown in FIG. 2.

It is noted that, in different embodiments, the inner pattern group 21 and the outer pattern group 22 may be formed in one single patterning process, or formed in two different patterning processes, respectively.

It is noted that the auxiliary pattern group 23 is employed to increase a density evenness of the wirings formed using various processes (e.g., etching, photolithography, thin film, diffusion, chemical-mechanical planarization (CMP), etc.), so as to improve a loading effect and/or proximity effect related to the processes.

In some embodiments, the auxiliary pattern group 23 may be omitted.

Figure 4:
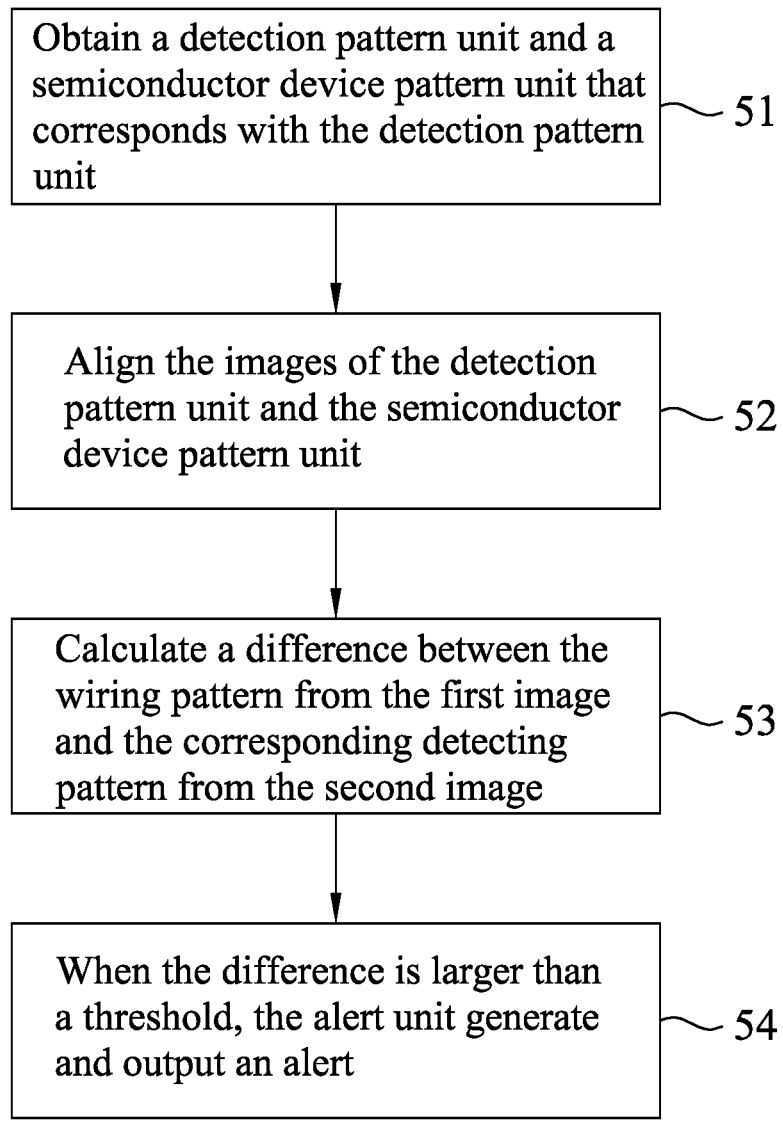
FIG. 4 is a flow chart illustrating steps of a method for detecting a pattern on a semiconductor device according to one embodiment of the disclosure.

FIG. 4 is a flow chart illustrating steps of a method for detecting a pattern on a semiconductor device according to one embodiment of the disclosure. In this embodiment, the method is implemented using the computer device that executes the pattern detecting system 300 as shown in FIG. 1.

In step 51, the data obtaining unit 31 obtains a detection pattern unit 2 and a to-be-detected pattern unit 4 that corresponds with the detection pattern unit 2.

In this embodiment, the detection pattern unit 2 may be one as shown in FIG. 2, and may be pre-stored in the storage medium of the computer device in the form of a GDS file, a GDSII file, an OASIS file, an MEBES file, a CAD file, an EDA file, etc., for generating a photomask.

In some embodiments, the detection pattern unit 2 may be a mask pattern that is generated based on a preset image dataset, and that is to be formed on a glass substrate using a patterning process.

In some embodiments, the detection pattern unit 2 may be a pattern that is generated based on the mask pattern, and that is to be formed on a semiconductor substrate (e.g., a silicon wafer) using a patterning process.

In this embodiment, the to-be-detected pattern unit 4 may be a mask pattern that is generated based on a preset image dataset (e.g., the detection pattern unit 2), and that is to be formed on a glass substrate using a patterning process.

In some embodiments, the to-be-detected pattern unit 4 may be a pattern that is generated based on the mask pattern, and that is formed on a semiconductor substrate (e.g., a silicon wafer) using a patterning process.

As such, the detection pattern unit 2 and the to-be-detected pattern unit 4 may be compared in a manner of wafer to wafer, mask to wafer, or mask to mask.

It is noted that the detection pattern unit 2 and the to-be-detected pattern unit 4 has the same circuit wiring patterns, and may be from a same or different sources (e.g., to be formed in separate processes or formed by different photomasks).

In the case that the detection pattern unit 2 and the to-be-detected pattern unit 4 are both to be formed on a semiconductor substrate using a patterning process, the detection pattern unit 2 and the to-be-detected pattern unit 4 may be formed using the same process (e.g., photolithography) with identical parameters (e.g., parameters associated with a photoresist or a photomask), or formed using the same process but with different parameters.

Figure 5:
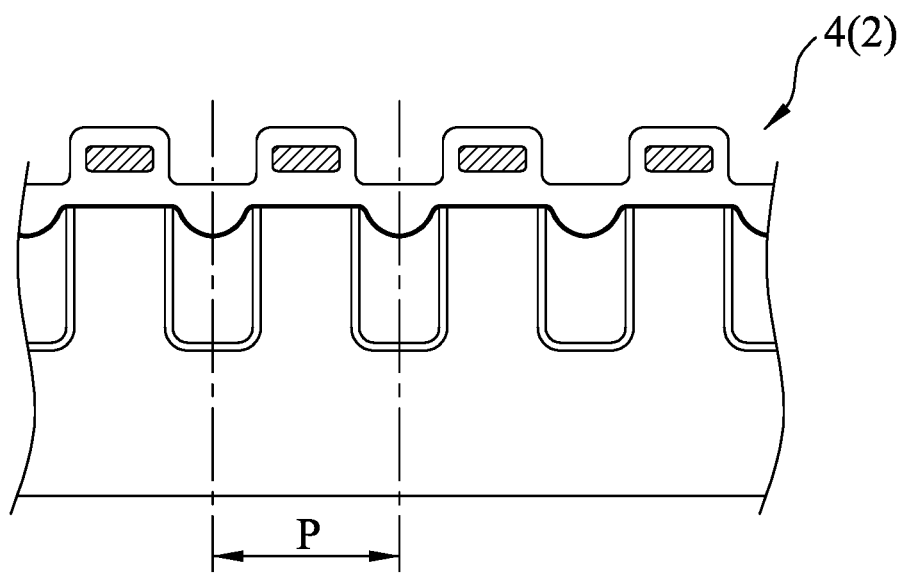
FIG. 5 is a fragmentary sectional view of a detection pattern unit or a to-be-detected pattern unit.

In some embodiments, the data obtaining unit 31 includes a scanning electron microscope (SEM) or a transmission electron microscope (TSM), and the detection pattern unit 2 and the to-be-detected pattern unit 4 may be top view images of patterns formed by a patterning process on a substrate, taken by the SEM or TEM. In some embodiments, a sectional view may be obtained (as shown in FIG. 5). In some embodiments, the data obtaining unit 31 includes a high resolution transmission electron microscope (HRTSM), and the atomic arrangement of the patterns can be seen on the images.

In this embodiment, the detection pattern unit 2 is a pattern that is generated based on the mask pattern, and that is to be formed on a semiconductor substrate using a patterning process. The to-be-detected pattern unit 4 has the same circuit wiring pattern as the detection pattern unit 2, and is formed on the semiconductor substrate using a single patterning process. It is noted that in some embodiments, the to-be-detected pattern unit 4 may be formed on the semiconductor substrate using more than one patterning processes. For example, it may be the case that the inner pattern group 41 is formed in one patterning process while the outer pattern group 42 is formed in another patterning process. In step 51, the data obtaining unit 31 obtains the to-be-detected pattern unit 4 on the selected area of the semiconductor substrate (not depicted in the drawings) after the patterning process, and then accesses the storage medium to obtain the detection pattern unit 2 having the same circuit wiring pattern as the to-be-detected pattern unit 4.

In some embodiments, the obtaining of the detection pattern unit 2 includes accessing an image file that is pre-stored in a storage medium of the computer device in the form of a GDS file, a GDSII file, an OASIS file, an MEBES file, a CAD file or an EDA file, and that is for generating a photomask, wherein the image file serves as the detection patter unit 2. Alternatively, the obtaining of the detection pattern unit 2 may include obtaining images of a pattern formed on a substrate using a photomask generated using the image file, wherein the images serve as the detection pattern unit 2. The image file may include an originally designed pattern that is intended to be formed as a photomask.

In some embodiments, the operations of step 51 includes obtaining images of a pattern formed on a substrate using a photomask generated using the image file, wherein the images serve as the to-be-detected pattern unit 4, and obtaining a part of the image file that corresponds with the to-be-detected pattern unit 4, wherein the part serves as the detection pattern unit 2. It is noted that the obtaining In some embodiments, the obtaining of the detection pattern unit 2 and the to-be-detected pattern unit 4 includes obtaining top view images or sectional view images of patterns formed by a patterning process on a substrate, wherein the top view images or sectional view images serve as the detection pattern unit 2 and the to-be-detected pattern unit 4. The patterns may be formed using a photomask generated based on the above image file.

In some embodiments, the detection pattern unit 2 is an image of a pattern formed on a substrate, and the semiconductor device pattern 4 is an image of a pattern formed on the same substrate or a separate substrate.

Figure 6:
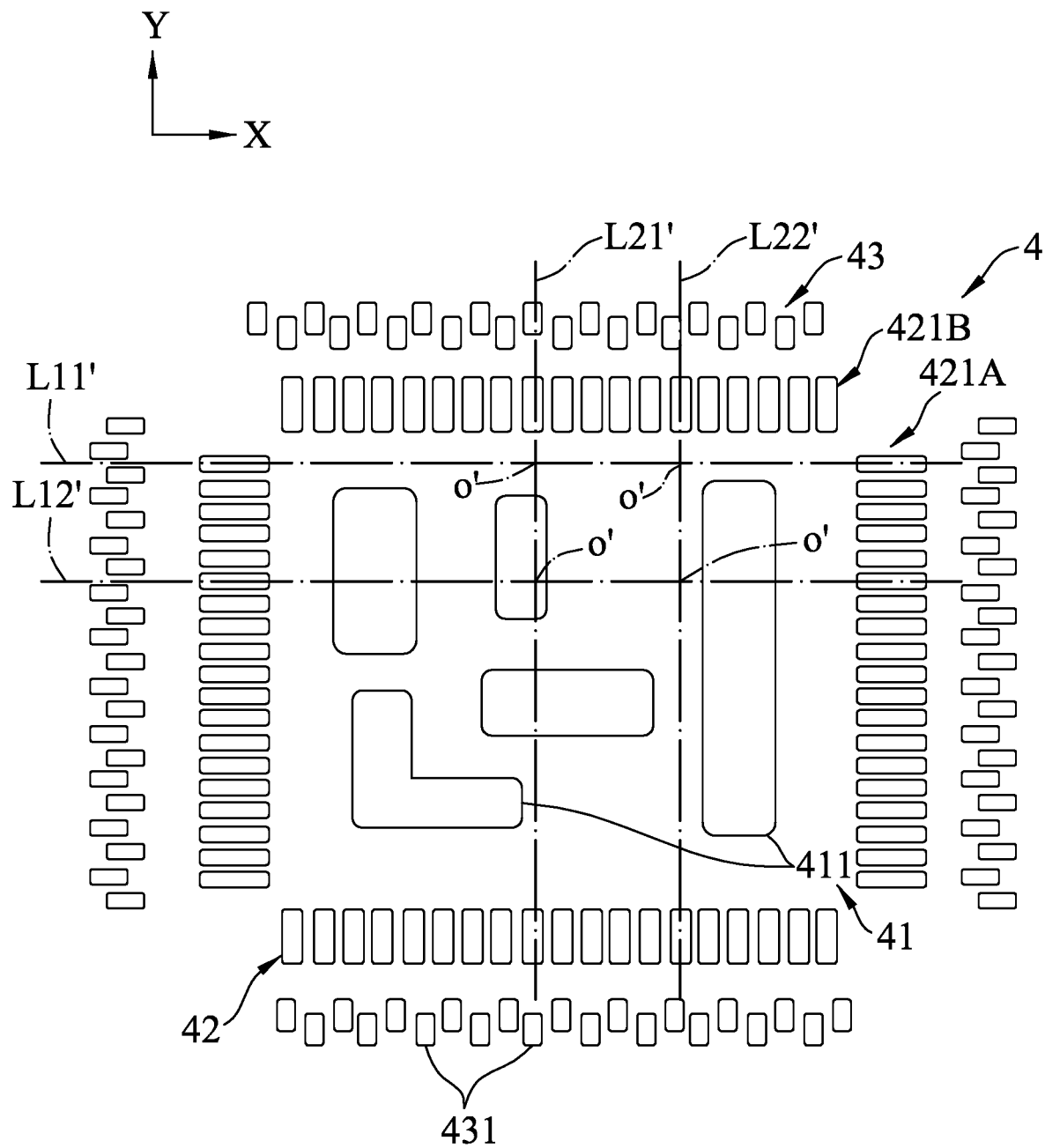
FIG. 6 is a top view of an exemplary to-be-detected pattern unit according to one embodiment of the disclosure.

FIG. 6 is a top view of an exemplary to-be-detected pattern unit 4 according to one embodiment of the disclosure. In this embodiment, the to-be-detected pattern unit 4 includes an inner pattern group 41, an outer pattern group 42 and an auxiliary pattern group 43 that correspond to the inner pattern group 21, the outer pattern group 22 and the auxiliary pattern group 23 of the detection pattern unit 2, respectively.

The inner pattern group 41 includes at least one wiring pattern 411 corresponding respectively to the at least one detecting pattern 211. In the example of FIG. 6, the inner pattern group 41 includes a plurality of wiring patterns 411 spaced apart from one another. The wiring patterns 411 may have shapes and sizes of specific semiconductor patterns (e.g., isolated patterns, high density patterns, or low density patterns). In this embodiment, for each of the two sets of positioning patterns 421A, 421B, a pitch dimension between adjacent two of the positioning patterns in one of the two lines in the set is the same as a pitch dimension between adjacent two of the positioning patterns in the other one of the two lines in the set. In this embodiment, the pitch dimensions between two adjacent positioning patterns included in the two sets of positioning patterns 421A, 421B are the same.

The outer pattern group 42 is located to surround the inner pattern group 41, and includes two sets of positioning patterns 421A, 421B corresponding respectively to the two sets of positioning detection patterns 221A, 221B in the detection pattern unit 2. Each of the two sets of positioning patterns 421A, 421B includes two lines of patterns that are arranged along a direction. That is to say, four lines of patterns are present and arranged around the inner pattern group 41 to form a near-square shape.

In this embodiment, the set of positioning patterns 421A includes two lines of patterns that are arranged along and opposite to each other in the direction X, and the set of positioning patterns 421B includes two lines of patterns that are arranged along and opposite to each other in the direction Y. Each of the two sets of positioning patterns 421A, 421B may be a high density pattern, a low density pattern, a mirror symmetric pattern, a horizontally symmetric pattern, or a vertically symmetric pattern.

The auxiliary pattern group 43 includes at least one line of auxiliary patterns 431 corresponding respectively to the at least one line of auxiliary patterns 231 in the detection pattern unit 2. The line of auxiliary patterns 431 may be disposed near a corresponding one of the sides of the outer pattern group 42 away from the inner pattern group 42. In this embodiment, the auxiliary pattern group 43 includes two lines of auxiliary patterns 431 that are arranged to extend along the direction X, and two lines of auxiliary patterns 431 that are arranged to extend along the direction Y. Each of the auxiliary patterns 431 has an inner end facing the outer pattern group 42 and an outer end facing away from the outer pattern group 42. For each line of auxiliary patterns 431, the inner ends respectively of the auxiliary patterns 431 are not arranged on a straight line, and the outer ends respectively of the auxiliary patterns 431 are not arranged on a straight line, meaning that the auxiliary patterns 431 are not aligned along the corresponding one of the direction X and the direction Y.

Then, in step 52, with respect to the detection pattern unit 2, the positioning unit 32 generates, for each of two different directions, two connecting lines each extending along the direction and each interconnecting two of the positioning detection patterns respectively from the two lines of patterns of one of the sets of positioning detection patterns 221A, 221B (four connecting lines in total), and four intersections defined by the connecting lines. In the example of FIG. 2, four connecting lines (L11, L12 along the direction X, and L21, L22 along the direction Y), and four intersections (o) are generated.

Further, with respect to the to-be-detected pattern unit 4, the positioning unit 32 generates, for each of the two different directions, two connecting lines each extending along the direction and each interconnecting two of the positioning patterns respectively from the two lines of patterns of one of the sets of positioning patterns 421A, 421B (four connecting lines in total), and four intersections defined by the connecting lines. In the example of FIG. 6, four connecting lines (L11', L12' along the direction X, and L21', L22' along the direction Y), and four intersections (o') are generated.

It is noted that in this embodiment, the connecting lines are generated to extend along the directions X and Y that are perpendicular to each other, in other embodiments, the connecting lines may be generated to extend along two directions that are not perpendicular to each other. Additionally, in some embodiments, additional connecting lines and intersections may be generated.

Figure 7:
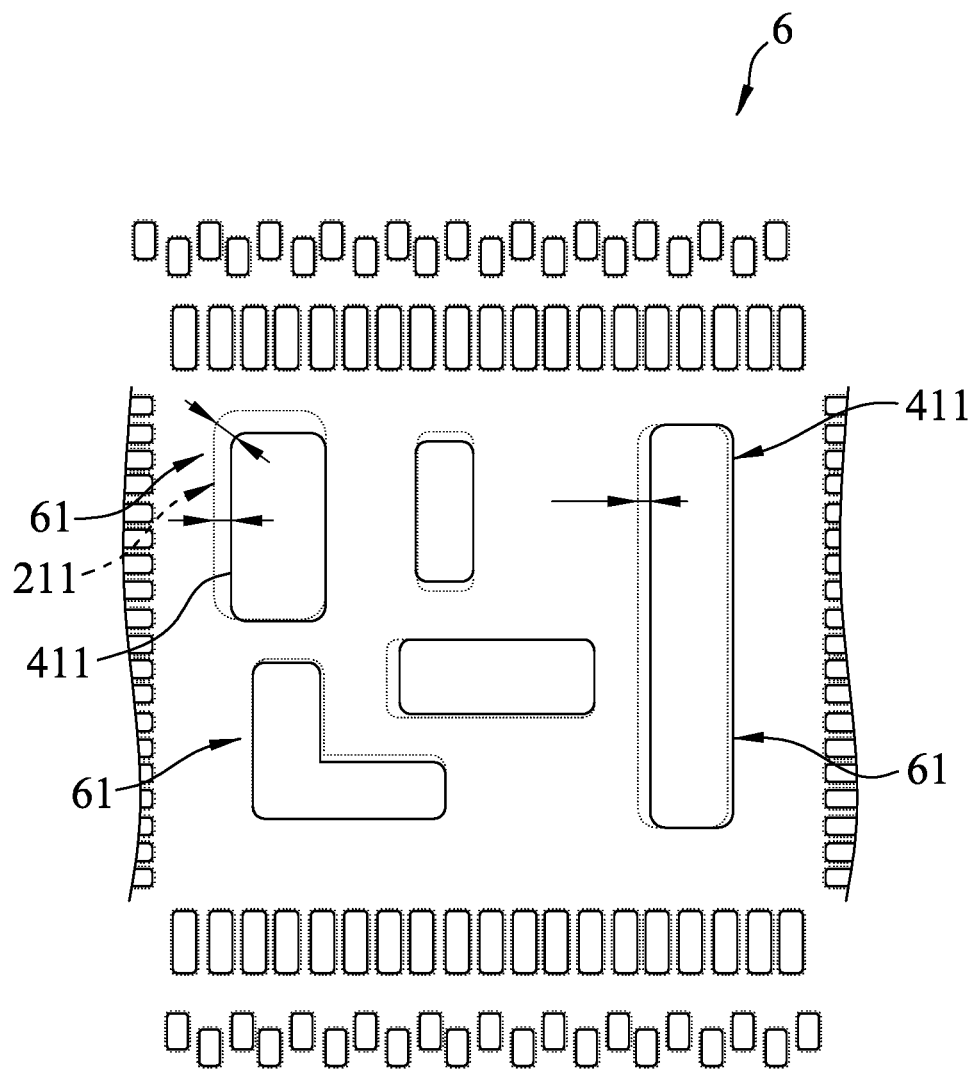
FIG. 7 is a top view of an exemplary superimposed image unit with dotted lines indicating the detection pattern unit and solid lines indicating a to-be-detected pattern unit.

After the connecting lines and intersections are generated, the positioning unit 32 superimposes a first image on a second image where the first image has the to-be-detected pattern unit 4 and the connecting lines and the second image has the detection pattern unit 2 and the connecting lines, and adjusts the relative position between the first image and the second image such that the connecting lines on the first image coincide respectively with the connecting lines on the second image. Alternatively, the relative position between the first image and the second image is adjusted to make the intersections on the first image coincide respectively with the intersections on the second image. As such, see FIG. 7, a superimposed image unit 6 that includes a number of superimposed patterns 61 may be obtained. Each of the superimposed patterns 61 includes one pattern from the first image (the wiring pattern 411) and one corresponding pattern from the second image (the detecting pattern 211). FIG. 7 is a top view of an exemplary superimposed image unit 6 with the dotted lines indicating the detection pattern unit 2 and the solid lines indicating the to-be-detected pattern unit 4.

The generation of the superimposed image unit 6 may include adjusting one or both of the first image and the second image (scaling up, scaling down, shifting, etc.), such that the connecting lines from the first image overlap the corresponding connecting lines from the second image, and/or the intersections (o) coincide the intersections (o'), respectively. It is noted that by adjusting the first image and/or second image to make the intersections (o) coincide respectively with the intersections (o'), the superimposed image unit 6 may be generated without the potential errors occurred during the generation of the connecting lines L11, L12, L21, L22, L11', L12', L21', and L22', and may result in a more accurate alignment of the first image and the second image.

It is noted that in this embodiment, the two sets of positioning patterns 421A, 421B are disposed at an outside portion of the to-be-detected pattern unit 4, such that the resulting superimposed image unit 6 must cover the wiring patterns 411. However, the arrangement of the sets of positioning patterns 421A, 421B is not limited to such.

In step 53, for each of the superimposed patterns 61, the computing unit 33 calculates a difference between the wiring pattern 411 from the first image and the corresponding detecting pattern 211 from the second image (e.g., a displacement from the pattern to the corresponding pattern). In some embodiments, multiple differences between the wiring pattern 411 and the detecting pattern 211 in different aspects are calculated by the computing unit 33.

Then, in step 54, when the difference between the wiring pattern from the first image and the corresponding wiring pattern from the second image calculated by the computing unit 33 is larger than a threshold, the alert unit 34 generates and outputs an alert.

In this embodiment, the threshold may be a tolerance associated with the patterning process, a user-defined displacement, or other values. The alert may include an audio signal, an image, a text message, etc., and may be outputted to notify a user (e.g., an operator).

It is noted that in some embodiments, the operations of step 54 may be omitted.

Figure 8:
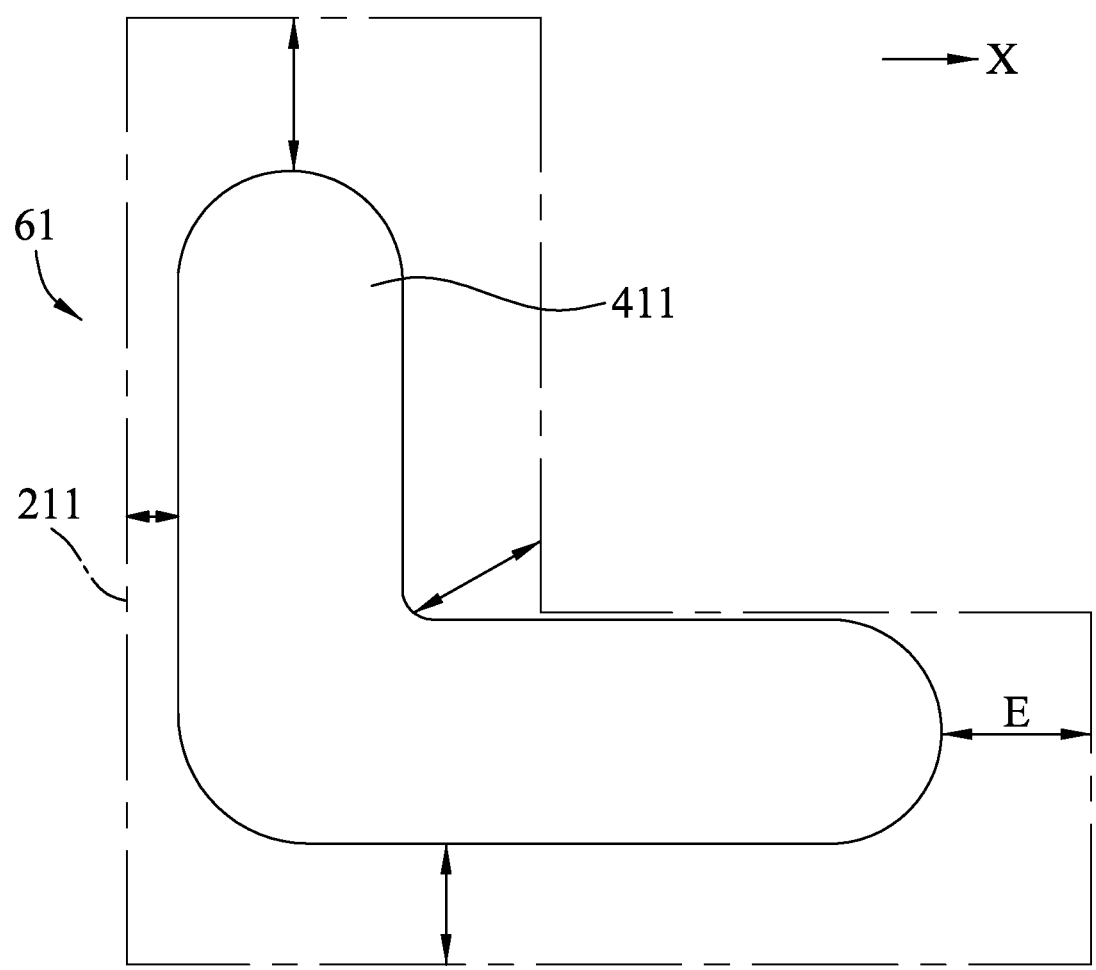
FIG. 8 is a top view of a part of the superimposed image unit, showing one superimposed pattern.

FIG. 8 is a top view of part of an exemplary superimposed image unit 6, showing one superimposed pattern 61. In the conventional method, the wiring pattern 411 (shown by solid lines) and the detecting pattern 211 (shown by broken lines) included in the superimposed pattern 61 are compared, and the detection pattern unit 2 is adjusted to accommodate a difference detected in the comparison. It is noted that while the conventional method is able to detect a critical dimension (CD) error between the wiring pattern 411 and the detecting pattern 211, it may not be able to detect other differences at the same time (e.g., an edge placement error (EPE), which is a difference between edges of the wiring pattern 411 and the detecting pattern 211 in the superimposed pattern 61, or a displacement between the wiring pattern 411 and the detecting pattern 211 on an edge of the superimposed pattern 61). On the contrary, the method as described in the embodiments of the disclosure is capable of detecting the above-mentioned difference (EPE), and therefore provides a more accurate detecting method, enabling subsequent correction and allowing generation of new photomask to be more accurate. Additionally, using the method of this disclosure, an overlay error between the groups of a semiconductor device may be accurately determined as well.

In some embodiments, the to-be-detected pattern unit 4 and the detection pattern unit 2 may be embodied using various images. For example, two images of a specific pattern formed by different implementations of a specific process may serve as the to-be-detected pattern unit 4 and the detection pattern unit 2 for comparison. Two images of two photomasks or two silicon wafers each containing the specific pattern but provided by different providers may serve as the to-be-detected pattern unit 4 and the detection pattern unit 2 for comparison. Two images of two different substrates (a wafer, a photomask, etc.) each containing the specific pattern may serve as the to-be-detected pattern unit 4 and the detection pattern unit 2 for comparison. By using one of the images as the detection pattern unit 2 (i.e., a reference for comparison), the method may be implemented to determine a difference between the two images (i.e., a difference attributed to the hardware equipment, the providers, the substrates, etc.) for correction.

In some embodiments, the inner pattern group 21 and the outer pattern group 22 may be formed in different patterning processes, and the method can still be implemented.

Figure 9:
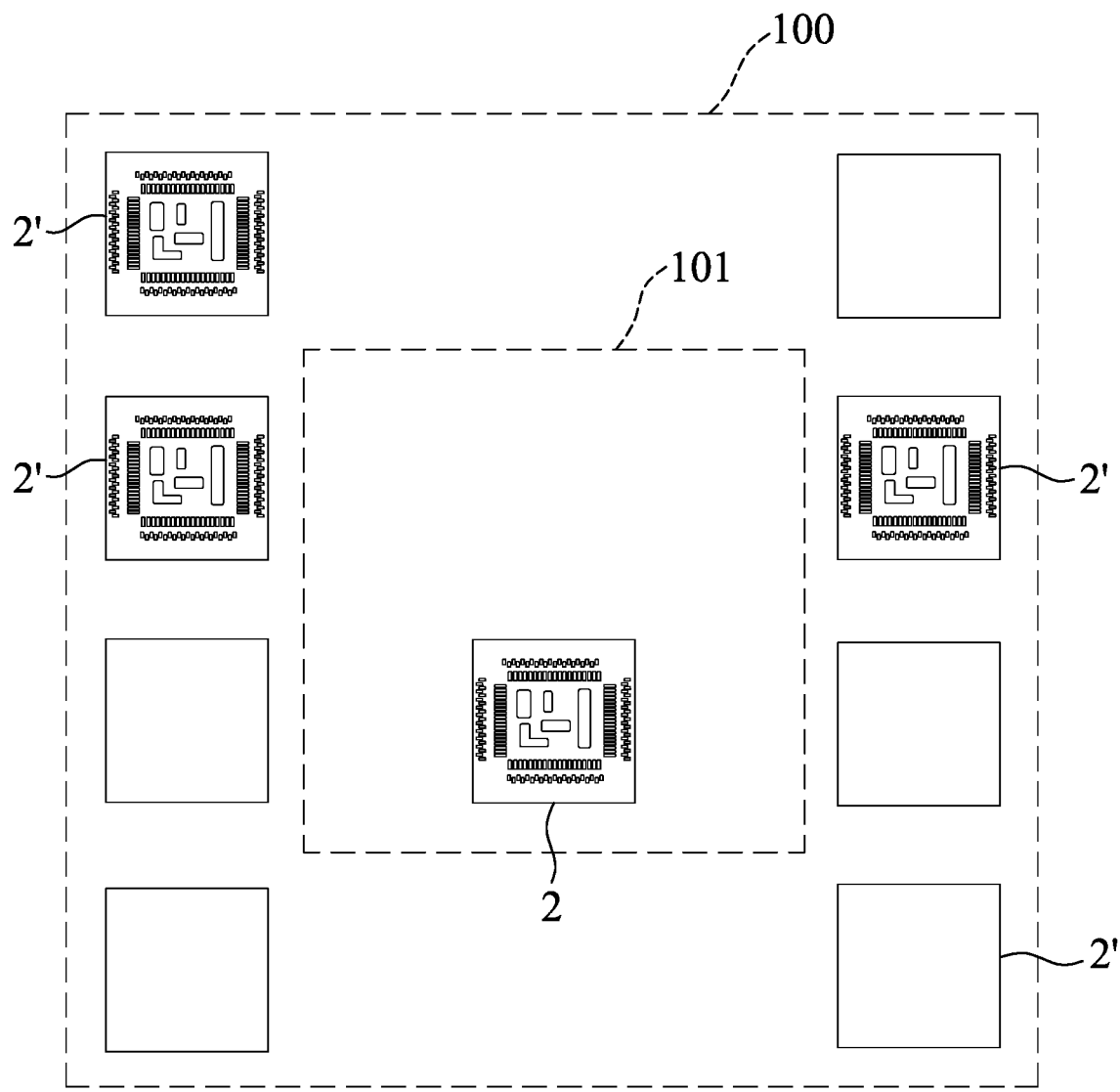
FIG. 9 is a top view of a substrate according to one embodiment of the disclosure.

FIG. 9 is a top view of a substrate 100 according to one embodiment of the disclosure. In this embodiment, the substrate 100 is made of a material different from the previous embodiments (i.e., a glass substrate) and is formed with a detection pattern unit 2 as described in the previous embodiments. The method may be implemented with respect to the detection pattern unit 2 and one of a plurality of detection pattern units 2'.

Each of the detection pattern units 2' may include a wire pattern that is included in a photomask pattern formed on the substrate 100 and that has a shape that is the same as the detection pattern unit 2. As such, the method as described in the previous embodiments may be implemented with each of the detection pattern units 2' serving as the to-be-detected pattern unit 4. It is noted that in some embodiments, each of the detection pattern units 2' may be formed on a substrate that is separate from the substrate 100 (e.g., formed on different substrates from the detection pattern unit 2).

A pellicle 101 may be disposed on a part of the substrate 100 for protecting one or more detection pattern units 2' and/or the detection pattern unit 2 from dusts. In this embodiment, the detection pattern unit 2 is under the pellicle 101, but in other embodiments, the pellicle 101 may be disposed such that the detection pattern unit 2 is not covered by the pellicle 101.

In the embodiment of FIG. 9, the detection pattern units 2' and the detection pattern unit 2, each being formed on a different substrate (or a different portion of a single substrate), may be compared using the method as described in the previous embodiments. A result of the comparison may then be used to determine whether the pattern formed on the substrate is formed as desired.

In some embodiments, the detection pattern units 2' are disposed outward of the detection pattern unit 2, and are not used for generating a photolithography pattern. That is to say, the detection pattern units 2' are disposed outside of the pellicle 101, and after the patterning process is implemented, no photolithography pattern is formed on the substrate based on the detection pattern units 2'.

It is noted that the pattern detecting system 300 used for implementing the method of FIG. 4 may have the correction unit 35, the data conversion unit 36, and the photomask writing unit 37 omitted.

Figure 10:
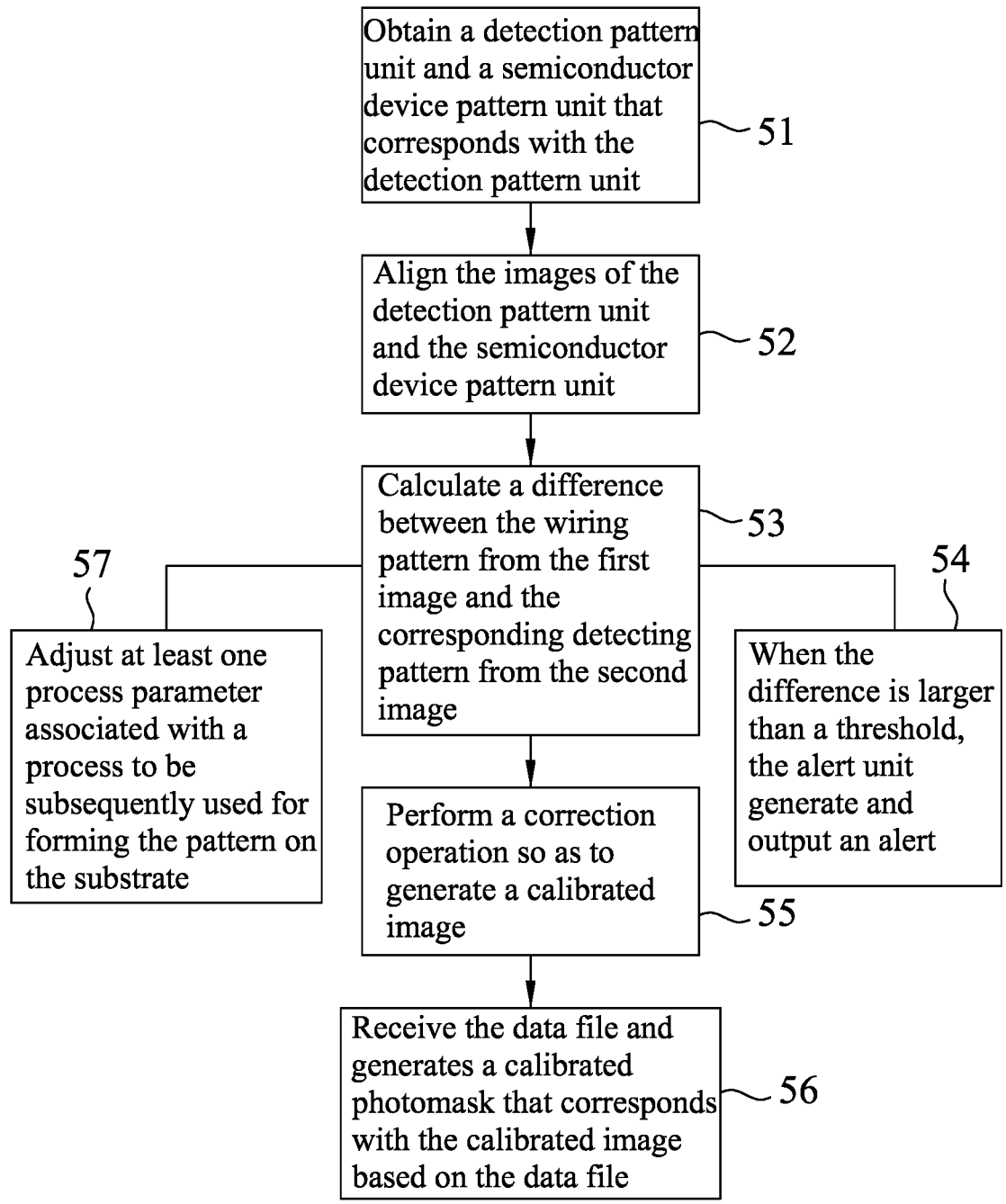
FIG. 10 is a flow chart illustrating steps of a method for detecting a pattern on a semiconductor device according to one embodiment of the disclosure.

FIG. 10 is a flow chart illustrating steps of a method for detecting a pattern on a semiconductor device according to one embodiment of the disclosure. In this embodiment, the method is implemented using the computer device that executes the pattern detecting system 300 as shown in FIG. 1.

In the method of FIG. 10, steps 51 to 53 of the method of FIG. 4 are first implemented, so as to, for each of the superimposed patterns 61, calculate a difference between the wiring pattern 411 from the first image and the corresponding wiring pattern 211 from the second image. The details of steps 51 to 53 are not repeated herein for the sake of brevity.

Afterward, in step 55, in response to receipt of the calculation result from the computing unit 33, the correction unit 35 operates a GDS, an OASIS program, a MEBES program, a CAD program or an EDA program to perform a correction operation on the to-be-detected pattern unit 4 based on the calculation, so as to generate a calibrated image. In use, the correction unit 35 may perform the correction operation on a MEBES file that corresponds with the wiring pattern 411, with reference to the difference between the wiring pattern 411 from the first image and the corresponding detecting pattern 211 from the second image. It is noted that the operations of adjusting MEBES file are known in the related art, and details thereof are omitted herein for the sake of brevity.

Then, the data conversion unit 36 converts the calibrated image into a data file in a data stream format for data exchange.

Then, in step 56, the photomask writing unit 37 receives the data file and generates a calibrated photomask that corresponds with the calibrated image based on the data file.

In one example as shown in FIGS. 7 and 8, the detection pattern unit 2 may be a GDS file, and in use, the GDS file may be subjected to an OPC operation and then used to generate a photomask using a MEBES program. The to-be-detected pattern unit 4 is a lithography pattern formed on a semiconductor substrate via a patterning process using a photomask made from the GDS file to serve as the detection pattern unit 2.

In this example, the method includes first obtaining a superimposed image unit 6, and calculating, for one of the superimposed patterns 61, a difference between the wiring pattern 411 from the first image and the corresponding detecting pattern 211 from the second image. Then, in response to receipt of the calculation result from the computing unit 33, the correction unit 35 operates a MEBES program to perform a correction operation, so as to generate a calibrated image. Then, the data conversion unit 36 converts the calibrated image into a data file in a data stream format for data exchange.

Then, in step 56, the photomask writing unit 37 receives the data file and generates a calibrated photomask that corresponds with the calibrated image based on the data file.

It is noted that in some embodiments, the operations of step 54 (see FIG. 4) are also implemented between steps 53 and 55.

By implementing the above method, the data for generating a photomask may be corrected after being compared with the pattern that is actually formed using the photomask, such that the subsequently made photomasks may be made with more accuracy.

In some embodiments, after the operations of step 53, another step 57 may be implemented.

As shown in FIG. 10, in step 57, the computing unit 33 accesses the storage medium to adjust at least one process parameter associated with a process to be subsequently used for forming the pattern on the substrate.

Specifically, for each of the processes, the storage medium stores a number of process parameters therein. In some embodiments, the process parameters may include processing temperature, processing time, etc. In other embodiments, the process parameters may be stored in a storage medium separate from the computer device (e.g., a cloud server), and may be accessed via a communication unit. The communication unit may include at least one of a radio-frequency integrated circuit (RFIC), a short-range wireless communication module supporting a short-range wireless communication network using a wireless technology of Bluetooth® and/or Wi-Fi, etc., or a mobile communication module supporting telecommunication using Long-Term Evolution (LTE), the third generation (3G) and/or fifth generation (5G) of wireless mobile telecommunications technology, and/or the like.

It is noted that during the patterning process, the resulting product may be affected by the process parameters. As such, after the operations of step 53 are completed, the computing unit 33 is configured to adjust the process parameter(s) based on the result of the comparison in step 53.

In practice, the computing unit 33 may select, from the storage medium, a to-be-adjusted parameter based on the difference calculated in step 53. When the difference is larger than a preset value, the corresponding process parameter(s) may need to be adjusted. In some cases, the adjustment may be a fixed-value adjustment. In some cases, the adjustment may include replacing one of the process parameters with another. After the adjustment, and a new to-be-detected pattern unit 4 is generated based on the adjustment, the operations of the method may be implemented again, and the computing unit 33 may calculate the difference again to determine whether further adjustment is necessary.

Then, in the next implementation of the patterning process, the adjusted process parameters from the operations of step 57 may be used, so as to improve the quality of the patterning process to be performed in the future.

In some embodiments, elements that may be adjusted by adjusting the process parameters include the shape of patterns or other parameters such as critical dimensions (CDs), angles, thicknesses, and/or rounding of an edge of a pattern, lines (e.g., width of the wirings), spacing, CDs of vias and holes that constitute the pattern. The differences calculated by the computing unit 33 may include an edge placement error (EPE), a position shift, and differences in the critical dimensions between the wiring patterns of the superimposed patterns 61. The thresholds may include values of one or more of critical dimensions, pitch dimension, area, rounding and EPE.

In some examples, the process parameters may be stored in the form of the following Table 1. Table 1 shows a pre-made detection pattern unit (IF) before a number of patterning processes (step 1, step 2, step 3) are implemented, the process parameters (P-A1 to P-C1, P-A2 to P-C2, and P-A3 to P-C3) corresponding to the patterning processes (step 1, step 2, step 3), and the resulting detection pattern units (IF1-IF3) that are formed on a substrate after the patterning processes (step 1, step 2, step 3) are implemented using the respective process parameters. In this embodiment, the process parameters may be different temperatures, step 1 may be photolithography, step 2 may be dry-etching, and step 3 may be wet-etching. It is noted that in other embodiments, additional patterning processes and process parameters may be present.

TABLE 1

|  | Step1 | Step2 | Step3 | Detection pattern unit |
|---|---|---|---|---|
| IF | P-A1 | P-A2 | P-A3 | IF-1 |
|  | P-B1 | P-B2 | P-B3 | IF-2 |
|  | P-C1 | P-C2 | P-C3 | IF-3 |

In use, after a pattern is formed on a substrate using steps 1 to 3 with one of the above sets of parameters (based on the detection pattern unit 2), the method may be implemented with the pattern serving as the to-be-detected pattern unit 4 to be compared with the corresponding one of the detection pattern units (IF1-IF3). When a difference is detected between the to-be-detected pattern unit 4 and the corresponding one of the detection pattern units above (e.g., when it is determined that a critical dimension of an element on the to-be-detected pattern unit 4 is significantly larger than that of pattern on the corresponding detection pattern unit), the computing unit 33 may select one of the process parameters that is associated with the critical dimension and adjust the one of the process parameters to another value that can reduce the critical dimension of the element. In different embodiments, based on the process parameters stored, the adjusted value may be picked from the storage medium or calculated using, for example, interpolation. The adjusted process parameters may then be used in the next implementation of the patterning process(es).

In embodiments, by aligning the two-dimensional images of the detection pattern unit 2 and the to-be-detected pattern unit 4 (which is actually formed on the semiconductor substrate), and calculating a difference between the patterns of the images, the pattern detecting system 300 may be able to operate a graphic data system (GDS), an open artwork system interchange system (OASIS) program or a manufacturing electron beam exposure system (MEBES), a computer aided design (CAD) program or an electronic design automation (EDA) program to perform a correction operation, so as to generate a calibrated image. The calibrated image may then be used to generate another photomask for subsequent use, and may be able to form the patterns that are more accurate.

In one example of FIG. 8, the edge placement error between the patterns may be calculated as follows. Firstly, a deviation (E) between edges of the two patterns of the superimposed pattern 61 along a specific direction (e.g., direction X of FIG. 8) is obtained in the form of a number of pixels. Then, using the number of pixels between the two adjacent patterns and a known or user-defined pitch dimension between two adjacent patterns of the set of the positioning detection patterns 221A or 221B along the specific direction, an actual distance indicated by one pixel can be calculated, and the edge placement error may be calculated by multiplying the deviation (E) by the actual distance indicated by one pixel. Using this manner, the EPE, a position shift, and differences in the critical dimension between the detecting pattern 211 and the wiring pattern 411 of the superimposed patterns 61 may be calculated in the operations of step 53 for the subsequent correction.

In embodiments, the to-be-detected pattern unit 4 may be an image of a lithography pattern formed on a semiconductor device using a patterning process based on a photomask generated from the detection pattern unit 2. The photomask is generated based on an originally designed GDS file, and is subjected to an OPC operation, and is in the form of a MEBES file. During the patterning process, due to the optical proximity effect, the wiring patterns 411 may have some issues such as corner rounding, shorter-than-expected wiring, altered distance between patterns, etc. The above issues cause differences between the detecting patterns 211 (the desired patterns) and the wiring patterns 411 (the actual patterns) to surface. In such cases, the method of embodiments of the disclosure is configured to adjust one of the first image and the second image using scaling (scale up or scale down) so as to ensure that each of the connecting lines L11, L12, L21 and L22 coincide with the corresponding connecting lines L11', L12', L21' and L22', respectively. Alternatively, the intersections (o) are adjusted to coincide with the corresponding intersections (o'), respectively. As such, the two-dimensional images of the detecting patterns 211 and the wiring patterns 411 may be aligned, so as to obtain a more accurate result.

To sum up, embodiments of the disclosure provide a detection pattern unit, and a method and a system for detecting a pattern on a semiconductor device using the detection pattern unit. The method is configured to align a two-dimensional first image of a detection pattern unit 2 and a two-dimensional second image of a to-be-detected pattern unit 4. Then, the method is configured to calculate one or more differences on patterns on the first and the second images, and to perform a correction operation to correct an EPE or other differences calculated. Afterward, a calibrated image from the correction operation is generated, and converted into a data file in a data stream format for data exchange. The data file may be used to generate a calibrated photomask for subsequent implementation of the patterning process. The calibrated photomask may then yield a pattern that is closer to the pattern originally designed.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment) but is intended to cover various arrangements included within the spirit and scope of the broadest interpretation so as to encompass all such modifications and equivalent arrangements.

What is claimed is:

1. A non-transitory computer-readable storage medium containing a detection pattern unit, the detection pattern unit comprising:
   an inner pattern group that includes a plurality of detecting patterns, the plurality of detecting patterns having shapes and sizes to correspond with semiconductor patterns having different pitch dimensions; and
   an outer pattern group that is located to surround the inner pattern group, and that includes two sets of patterns that are arranged around the inner pattern group to form a near-square shape, each of the two sets of the patterns including two lines of positioning detection patterns that are located on opposite sides and arranged along an extending direction of the sides; and
   an auxiliary pattern group that is located outside the outer pattern group and that includes at least one line of auxiliary patterns which is disposed at a side of the outer pattern group and which is arranged parallel to a direction in which the side extends, each of the auxiliary patterns having an inner end facing the outer pattern group and an outer end facing away from the outer pattern group;
   wherein:
   for each of the two sets of patterns, a pitch dimension in one of the two lines of positioning detection patterns of the set is the same as a pitch dimension in the other of the two lines of positioning detection patterns of the set;
   the pitch dimension in one of the two lines of one of the sets of patterns is either the same as or different from the pitch dimension in one of the two lines of the other one of the sets; and
   either the inner ends respectively of the auxiliary patterns are not arranged on a straight line, or the outer ends respectively of the auxiliary patterns are not arranged on a straight line, or the inner ends of the auxiliary patterns are not arranged on a straight line and the outer ends of the auxiliary patterns are not arranged on a straight line.

2. The non-transitory computer-readable storage medium of claim 1, wherein:
   for each of the two sets of patterns, each of the positioning detection patterns has an inner end facing said inner pattern group and an outer end facing away from said inner pattern group,
   for each of the two lines of each of the sets of the patterns, either the inner ends respectively of the positioning detection patterns are aligned along a straight line, or the outer ends respectively of the positioning detection patterns are aligned along a straight line, or the inner ends of the positioning detection patterns are aligned along a straight line and the outer ends respectively of the positioning detection patterns are aligned along a straight line; and
   an angle defined by the straight lines associated respectively with the two sets of patterns is a right angle.

3. The non-transitory computer-readable storage medium of claim 1, wherein the outer ends of the auxiliary patterns are not arranged on a straight line.

4. A method for detecting a pattern on a semiconductor device, implemented using a computer device and comprising:
   obtaining the detection pattern unit of claim 1 and a to-be-detected pattern unit that corresponds with the detection pattern unit, the to-be-detected pattern unit including an inner pattern group that includes at least one wiring pattern, and two sets of positioning patterns that respectively correspond with the two sets of positioning detection patterns, each of the two sets of positioning patterns including two lines of the positioning patterns that are arranged along a direction, wherein for each of the two sets of positioning patterns, a pitch dimension in one of the two lines of the set is the same as a pitch dimension in the other one of the two lines of the set;
   with respect to the to-be-detected pattern unit, generating, for each of the two different directions, two connecting lines each extending along the direction and each interconnecting two of the positioning patterns respectively from the two lines of positioning patterns of one of the sets of positioning patterns, and four intersections defined by the connecting lines;
   superimposing a first image on a second image, where the first image has the to-be-detected pattern unit and the connecting lines generated with respect to the to-be-detected pattern unit, and the second image has the detection pattern unit and the connecting lines generated with respect to the detection pattern unit;

adjusting a relative position between the first image and the second image such that the connecting lines of the first image coincide respectively with the connecting lines of the second image or such that the intersections of the first image coincide respectively with the intersections of the second image, so as to obtain a superimposed image unit that includes a number of superimposed patterns, each of the superimposed patterns including one of the at least one wiring pattern from the first image and one of the at least one detecting pattern from the second image that corresponds to said one of the at least one wiring pattern; and calculating a difference between said one of the at least one wiring pattern from the first image and said one of the at least one detecting pattern from the second image.

5. The method of claim 4, further comprising:

after the calculating, operating one of a graphic data system (GDS), an open artwork system interchange system (OASIS) program, a manufacturing electron beam exposure system (MEBES) program, a computer aided design (CAD) program or an electronic design automation (EDA) program to perform a correction operation on the to-be-detected pattern unit based on the calculation, so as to generate a calibrated image that is used for generating a calibrated photomask.

6. The method of claim 4, further comprising:

when the difference calculated is larger than a threshold, generating and outputting an alert.

7. The method of claim 6, wherein:

the calculation of the difference includes calculating an edge placement error (EPE), a position shift, and differences in the critical dimensions between the pattern from the first image or the corresponding pattern from the second image; and the threshold includes a value of one of a critical dimension, pitch dimension, area, rounding, or EPE.

8. The method of claim 6, further comprising, after the calculating, adjusting at least one process parameter associated with a process to be subsequently used for forming a pattern on a substrate based on the result of the calculating.

9. The method of claim 4, wherein the detection pattern unit is an image of a pattern formed on a substrate, and the semiconductor device pattern is an image of a pattern formed on the same substrate or a separate substrate.

10. The method of claim 4, wherein the obtaining of the detection pattern unit includes one of:

accessing an image file that is pre-stored in the non-transitory computer-readable storage medium of the computer device in the form of one of a graphic data system (GDS) file, a GDSII file, an open artwork system interchange system (OASIS) file, a manufacturing electron beam exposure system (MEBES) file, a computer aided design (CAD) file or an electronic design automation (EDA) file and that is for generating a photomask, the image file serving as the detection pattern unit; and obtaining images of a pattern formed on a substrate using a photomask generated using the image file, the images serving as the semiconductor device pattern.

11. The method of claim 4, wherein the obtaining of the detection pattern unit and the to-be-detected pattern unit includes obtaining top view images or sectional view images of patterns formed by a patterning process on a substrate, the top view images or sectional view images serving as the detection pattern unit and the to-be-detected pattern unit.

12. The method of claim 4, wherein the calculation of the difference includes:

obtaining a difference between edges respectively of said one of the at least one wiring pattern from the first image and said one of the at least one detecting pattern from the second image along a specific direction in the form of a number of pixels;

using a known or user-defined pitch dimension and the number of pixels between the two adjacent patterns to calculate an actual distance indicated by one pixel.

13. The method of claim 4, further comprising, after the calculating, adjusting at least one process parameter associated with a process to be subsequently used for forming a pattern on a substrate based on the result of the calculating.

14. A system comprising:

a data obtaining unit configured to obtain the detection pattern unit of claim 1 and a to-be-detected pattern unit that corresponds with the detection pattern unit, the to-be-detected pattern unit including an inner pattern group that includes at least one wiring pattern, and two sets of positioning patterns that respectively correspond with the two sets of positioning detection patterns, each of the two sets of positioning patterns including two lines of the positioning patterns that are arranged along a direction, wherein for each of the two sets of positioning patterns, a pitch dimension in one of the two lines of the set is the same as a pitch dimension in the other one of the two lines of the set;

a positioning unit that is configured to:

with respect to the to-be-detected pattern unit, generate, for each of the two different directions, two connecting lines each extending along the direction and each interconnecting two of the positioning patterns respectively from the two lines of positioning patterns of one of the sets of positioning patterns, and four intersections defined by the connecting lines;

superimpose a first image on a second image, where the first image has the to-be-detected pattern unit and the connecting lines generated with respect to the to-be-detected pattern unit, and the second image has the detection pattern unit and the connecting lines generated with respect to the detection pattern unit; and adjust a relative position between the first image and the second image such that the connecting lines of the first image coincide respectively with the connecting lines of the second image, or such that the intersections of the first image coincide respectively with the intersections of the second image, so as to obtain a superimposed image unit that includes a number of superimposed patterns, each of the superimposed patterns including one of the at least one wiring pattern from the first image and one of the at least one detecting pattern from the second image that corresponds to said one of the at least one wiring pattern; and a computing unit that is configured to, calculate a difference between said one of the at least one wiring pattern from the first image and said one of the at least one detecting pattern from the second image.

15. The system of claim 14, further comprising:

a correction unit that is configured to, in response to receipt of the calculation result from said computing unit, operate one of a graphic data system (GDS), an open artwork system interchange system (OASIS) program, a manufacturing electron beam exposure system (MEBES) program a computer aided design (CAD) file or an electronic design automation (EDA) file to perform a correction operation on the to-be-detected pattern unit based on the calculation, so as to generate a calibrated image;

a data conversion unit that is configured to convert the calibrated image into a data file in a data stream format for data exchange; and a photomask writing unit that is configured to receive the data file and generate a calibrated photomask that corresponds with the calibrated image based on the data file.

16. The system of claim 14, further comprising an alert unit that is configured to, when the difference calculated by said computing unit is larger than a threshold, generate and output an alert.

* * * * *